United States Patent
Yoshioka et al.

(10) Patent No.: US 8,963,204 B2
(45) Date of Patent: Feb. 24, 2015

(54) SEMICONDUCTOR DEVICE AND METHOD FOR MANUFACTURING SAME

(71) Applicant: Kabushiki Kaisha Toshiba, Minato-ku, Tokyo (JP)

(72) Inventors: Akira Yoshioka, Kanagawa (JP); Yasunobu Saito, Tokyo (JP); Hidetoshi Fujimoto, Kanagawa (JP); Tetsuya Ohno, Kanagawa (JP); Toshiyuki Naka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/786,359

(22) Filed: Mar. 5, 2013

(65) Prior Publication Data

US 2014/0077263 A1  Mar. 20, 2014

(30) Foreign Application Priority Data

Sep. 20, 2012 (JP) ................. 2012-207234

(51) Int. Cl.
*H01L 29/66* (2006.01)
*H01L 29/20* (2006.01)
(Continued)

(52) U.S. Cl.
CPC ...... *H01L 29/2003* (2013.01); *H01L 21/02389* (2013.01); *H01L 29/872* (2013.01); *H01L 29/7787* (2013.01); *H01L 29/205* (2013.01); *H01L 29/207* (2013.01); *H01L 29/417* (2013.01)
USPC ........................................ 257/191

(58) Field of Classification Search
CPC ............ H01L 21/0217; H01L 21/26553; H01L 29/2003; H01L 29/66462; H01L 29/778; H01L 29/42316; H01L 29/205; H01L 29/7781; H01L 29/7787; H01L 29/0692
USPC .......... 257/76, 77, 79, 191, 194, E21.11, 257/E21.342, E21.68, E21.407, E29.091, 257/E21.403, E29.078, E29.119, E29.14, 257/E29.464, E29.252; 438/172, 194
See application file for complete search history.

(56) References Cited

U.S. PATENT DOCUMENTS 7,071,526 B2 * 7/2006 Ando et al. .................. 257/473
2008/0157121 A1 * 7/2008 Ohki ............................ 257/194

(Continued)

FOREIGN PATENT DOCUMENTS

| JP | 11-176839 A | 7/1999 |
| JP | 2010-258148 A | 11/2010 |
| JP | 2011-082552 A | 4/2011 |
| JP | 2011146613 A | 7/2011 |

OTHER PUBLICATIONS

Japanese Office Action dated Dec. 11, 2014, issued in counterpart Japanese Application No. 2012-207234.

*Primary Examiner* — Brook Kebede
(74) *Attorney, Agent, or Firm* — Holtz, Holtz, Goodman & Chick PC (57) ABSTRACT

According to one embodiment, a semiconductor device includes a first nitride semiconductor layer, a second nitride semiconductor layer, a third nitride semiconductor layer, an insulating film, an ohmic electrode, and a Schottky electrode. A surface region of the third nitride semiconductor layer between the ohmic electrode and the Schottky electrode contains an element heterogeneous with the constituent element of the third nitride semiconductor layer at a higher concentration than a region of the third nitride semiconductor layer of the second nitride semiconductor layer side.

9 Claims, 6 Drawing Sheets

(51) Int. Cl.
*H01L 21/02* (2006.01)
*H01L 29/872* (2006.01)
*H01L 29/778* (2006.01)
*H01L 29/205* (2006.01)
*H01L 29/207* (2006.01)
*H01L 29/417* (2006.01)

(56) References Cited

U.S. PATENT DOCUMENTS

2008/0237605 A1* 10/2008 Murata et al. .................. 257/76
2011/0049574 A1   3/2011 Ueno et al.
2012/0080687 A1   4/2012 Kuraguchi

* cited by examiner

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2012-207234, filed on Sep. 20, 2012; the entire contents of which are incorporated herein by reference.

FIELD

Embodiments described herein relate generally to a semiconductor device and a method for manufacturing a semiconductor device.

BACKGROUND

The importance of energy-saving systems is growing due to such problems as environmental pollution and resource depletion, including global warming. With this trend, great attention has recently been given to the energy-saving effect of improving the power conversion efficiency of actual equipment which uses the energy of generated and supplied electrical power. The efficiency improvement of power conversion requires the performance improvement of switching devices used in the conversion circuit.

As such switching devices, power semiconductor devices are used. Thus, the performance improvement of power conversion circuits requires the performance improvement of power semiconductor devices. As the result of recent technology advancement, the performance of silicon power semiconductor devices currently in widespread use is reaching the limit imposed by the characteristics of the silicon material.

Against this background, research and development activities have recently been increased toward the performance improvement of power devices by the renewal of semiconductor materials. Gallium nitride-based materials are known as a strong candidate for such new materials.

BRIEF DESCRIPTION OF THE DRAWINGS

FIG. 2A to FIG. 4B are schematic sectional views showing a method for manufacturing the semiconductor device of the first embodiment;

DETAILED DESCRIPTION

According to one embodiment, a semiconductor device includes a first nitride semiconductor layer, a second nitride semiconductor layer, a third nitride semiconductor layer, an insulating film, an ohmic electrode, and a Schottky electrode. The first nitride semiconductor layer contains a group III element. The second nitride semiconductor layer is provided on the first nitride semiconductor layer, has a larger bandgap than the first nitride semiconductor layer, and contains a group III element. The third nitride semiconductor layer is provided on the second nitride semiconductor layer and contains a group III element. The insulating film is in contact with the third nitride semiconductor layer and is provided on the third nitride semiconductor layer. The ohmic electrode is in ohmic contact with the second nitride semiconductor layer. The Schottky electrode is in Schottky contact with the second nitride semiconductor layer. A surface region of the third nitride semiconductor layer between the ohmic electrode and the Schottky electrode contains an element heterogeneous with the constituent element of the third nitride semiconductor layer at a higher concentration than a region of the third nitride semiconductor layer of the second nitride semiconductor layer side.

Embodiments will now be described with reference to the drawings. In the drawings, like components are labeled with like reference numerals.

(First Embodiment)

Figure 1:
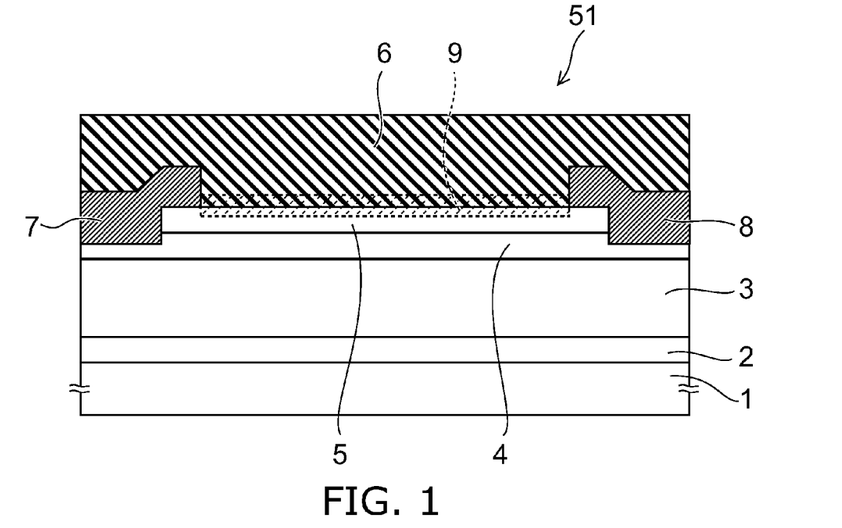
FIG. 1 is a schematic sectional view of a semiconductor device of a first embodiment.

FIG. 1 is a schematic sectional view of a semiconductor device 51 of a first embodiment. In the first embodiment, the semiconductor device 51 is exemplified by a Schottky barrier diode.

The semiconductor device 51 of the first embodiment has a heterojunction structure of a channel layer 3 as a first nitride semiconductor layer and a barrier layer 4 as a second nitride semiconductor layer having a larger bandgap than the channel layer 3.

The channel layer 3 is provided on a substrate 1 via a buffer layer 2. The barrier layer 4 is provided on the channel layer 3.

On the barrier layer 4, a cap layer 5 as a third nitride semiconductor layer is provided. The cap layer 5 also makes a heterojunction with the barrier layer 4. The cap layer 5 covers and protects the upper surface of the barrier layer 4.

The channel layer 3, the barrier layer 4, and the cap layer 5 are nitride semiconductor layers containing a group III element. The channel layer 3, the barrier layer 4, and the cap layer 5 are made of nitride semiconductors containing a group III element such as gallium (Ga), aluminum (Al), and indium (In), and represented by $In_xAl_yGa_{1-x-y}N$ ($0 \leq x \leq 1$, $0 \leq y \leq 1$, $x+y \leq 1$).

For instance, the channel layer 3 is a non-doped GaN layer. The barrier layer 4 is an n-type AlGaN layer. The cap layer 5 is an n-type or non-doped GaN layer.

The substrate 1 and the buffer layer 2 are made of materials suitable for epitaxial growth of a nitride semiconductor containing a group III element. The substrate 1 can be made of e.g. sapphire, SiC, Si, or GaN. The buffer layer 2 can be made of e.g. AlN or AlGaN.

The cap layer 5 is formed on the entire surface of the barrier layer 4 as described later. Then, part of the cap layer 5 is removed, and part of the barrier layer 4 is exposed. On the exposed portion of the barrier layer 4, an anode electrode 7 and a cathode electrode 8 are provided.

The anode electrode 7 is a Schottky electrode in Schottky contact with the barrier layer 4. The cathode electrode 8 is an ohmic electrode in ohmic contact with the barrier layer 4.

The anode electrode 7 covers a step portion between the surface of the barrier layer 4 and the surface of the cap layer 5. Part of the anode electrode 7 extends over the surface of the cap layer 5. The cathode electrode 8 covers a step portion between the surface of the barrier layer 4 and the surface of the cap layer 5 at a position spaced from the anode electrode 7. Part of the cathode electrode 8 extends over the surface of the cap layer 5.

An insulating film 6 is provided on the cap layer 5, on the anode electrode 7, and on the cathode electrode 8. The insulating film 6 is an inorganic film such as silicon nitride film. Alternatively, the insulating film 6 may be a silicon oxide film or silicon oxynitride film.

The insulating film 6 is in contact with the surface of the cap layer 5, and covers and protects the surface of the cap layer 5. Part of the anode electrode 7 and part of the cathode electrode 8 are exposed from the insulating film 6 and connected to a wiring layer, not shown.

In the heterojunction structure of the channel layer 3 and the barrier layer 4, the barrier layer 4 has a smaller lattice constant than the channel layer 3. Thus, a strain occurs in the barrier layer 4. By the piezoelectric effect due to this strain, piezoelectric polarization occurs in the barrier layer 4. Thus, a two-dimensional electron gas is distributed near the interface of the channel layer 3 with the barrier layer 4. This two-dimensional electron gas serves as a current path between the anode electrode 7 and the cathode electrode 8 in the Schottky barrier diode. The rectifying action of the diode is obtained by the Schottky barrier resulting from the junction between the anode electrode 7 and the barrier layer 4.

The semiconductor device 51 of the embodiment is suitable for e.g. a power device applied to power conversion. In power devices, between breakdown voltage and on-resistance, there is a trade-off determined by the device material. According to the embodiment, a nitride semiconductor having a wider bandgap than silicon is used. Thus, the trade-off between breakdown voltage and on-resistance determined by the device material can be improved relative to silicon. This enables lower on-resistance and higher breakdown voltage.

Furthermore, according to the embodiment, in the surface region of the cap layer 5 in contact with the insulating film 6 between the anode electrode 7 and the cathode electrode 8, an element heterogeneous or homogeneous with the constituent element of the cap layer 5 is implanted by ion implantation technique. In the figure, the region 9 with the ion-implanted element distributed therein is schematically shown by the dashed line.

The ion-implanted surface region of the cap layer 5 is a region having a depth of e.g. approximately 2-20 nm from the interface between the cap layer 5 and the insulating film 6.

The constituent element of the cap layer 5 is an element such as gallium (Ga), aluminum (Al), indium (In), and nitrogen (N). The element implanted into the surface region of the cap layer 5 and being heterogeneous with the constituent element of the cap layer 5 is an element such as boron (B), argon (Ar), iron (Fe), fluorine (F), and chlorine (Cl).

The above heterogeneous element is implanted exclusively into the surface region of the cap layer 5, and does not reach the barrier layer 4 below the cap layer 5. Furthermore, after the ion implantation, annealing for diffusing the implanted element is not performed.

Thus, the concentration of the above heterogeneous element is changed in the thickness direction of the cap layer 5. The heterogeneous element concentration of the surface region of the cap layer 5 is higher than the heterogeneous element concentration of the region of the cap layer 5 on the barrier layer 4 side below the surface region. The region of the cap layer 5 below the surface region scarcely contains the above heterogeneous element implanted by ion implantation technique.

Here, the cap layer 5 contains a heterogeneous element resulting from the raw material for film formation (such as carbon and hydrogen). However, the concentration of such elements is scarcely changed in the thickness direction.

As described later, after the insulating film 6 is formed on the cap layer 5, ion implantation is performed from the upper surface side of the insulating film 6. Due to variation in the implantation depth control at this time, the region containing the above heterogeneous element is distributed over the surface region of the cap layer 5 and the region of the insulating film 6 on the cap layer 5 side across the interface between the cap layer 5 and the insulating film 6.

In the ion-implanted region 9, the crystal of the cap layer 5, and interface levels contributing to hopping conduction and existing at the interface between the cap layer 5 and the insulating film 6, are destroyed by the impact of the implanted element. Thus, the ion-implanted region 9 has high insulating property. This can significantly reduce the leakage current between the anode electrode 7 and the cathode electrode 8 via the interface between the cap layer 5 and the insulating film 6.

Ion implantation is not performed on the channel layer 3 and the barrier layer 4. Thus, the channel layer 3 and the barrier layer 4 have high crystallinity. Accordingly, the current path (two-dimensional electron gas) is not affected by the ion implantation. Thus, the on-resistance of the Schottky barrier diode is not affected by the ion implantation.

Furthermore, interface levels existing at the interface between the cap layer 5 and the insulating film 6 are destroyed. This can suppress the phenomenon (current collapse phenomenon) in which electrons are trapped by the above interface levels and cause the increase of on-resistance upon application of high voltage.

The surface region of the cap layer 5 is not limited to being ion-implanted with an element heterogeneous with the constituent element of the cap layer 5. An element homogeneous with the constituent element of the cap layer 5 may be implanted. Also in this case, in the ion-implanted region 9, the crystal of the cap layer 5 and interface levels existing at the interface between the cap layer 5 and the insulating film 6 are destroyed by the impact of the implanted element. Thus, the ion-implanted region 9 has high insulating property. This can significantly reduce the leakage current between the anode electrode 7 and the cathode electrode 8 via the interface between the cap layer 5 and the insulating film 6. Furthermore, this can also suppress the current collapse phenomenon.

As an element homogeneous with the constituent element of the cap layer 5, for instance, nitrogen (N) is implanted into the surface region of the cap layer 5 by ion implantation technique. Nitrogen is implanted exclusively in the surface region of the cap layer 5. Thus, the nitrogen concentration of the surface region of the cap layer 5 is made higher than the nitrogen concentration of the region on the barrier layer 4 side of the surface region.

Thus, in the surface region of the cap layer 5, the composition ratio of the group III element (e.g., Ga) to nitrogen is changed from the composition ratio at the time of film formation. The number of bonds between the group III element and nitrogen (Ga—N bonds) in the surface region of the cap layer 5 in contact with the insulating film 6 between the anode electrode 7 and the cathode electrode 8 is made smaller than the number of bonds between the group III element and nitrogen (Ga—N bonds) in the region of the cap layer 5 on the barrier layer 4 side of the surface region.

The number of Ga—N bonds in the cap layer 5 can be detected by e.g. analyzing the half-width and peak intensity of the Ga—N bond peak by XPS (X-ray photoelectron spectroscopy) technique.

In XPS technique, the sample surface is irradiated with X-rays, and the emitted photoelectrons are detected. The emitted photoelectrons are attributed to inner-shell electrons of the atoms of interest. The energy thereof is determined for each element. Thus, knowledge on the kind, abundance, and chemical bonding state of the sample surface can be obtained by measuring the energy distribution of photoelectrons emitted by X-ray irradiation.

Next, with reference to FIGS. 2A to 4B, a method for manufacturing the semiconductor device 51 of the first embodiment is described.

Figure 2A:
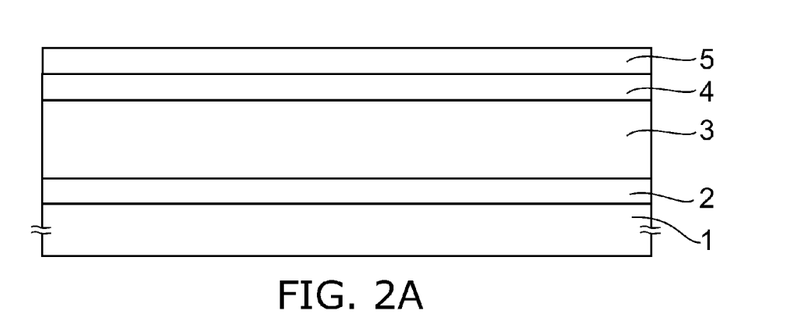

On a substrate 1, as shown in FIG. 2A, a buffer layer 2, a channel layer 3, a barrier layer 4, and a cap layer 5 are epitaxially grown in this order by e.g. MOCVD (metal organic chemical vapor deposition) technique.

Figure 2B:
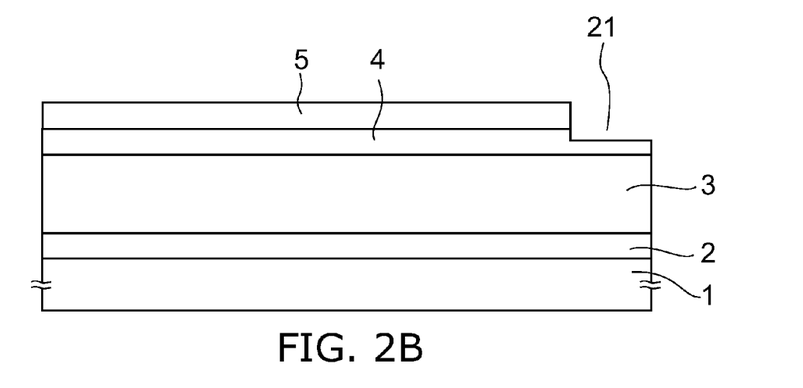

After forming the cap layer 5, as shown in FIG. 2B, part of the cap layer 5 is etched to form a recess 21. For instance, by RIE (reactive ion etching) technique using a chlorine-based gas, etching is performed halfway in the thickness direction of the barrier layer 4. The barrier layer 4 is exposed at the bottom of the recess 21.

Figure 3A:
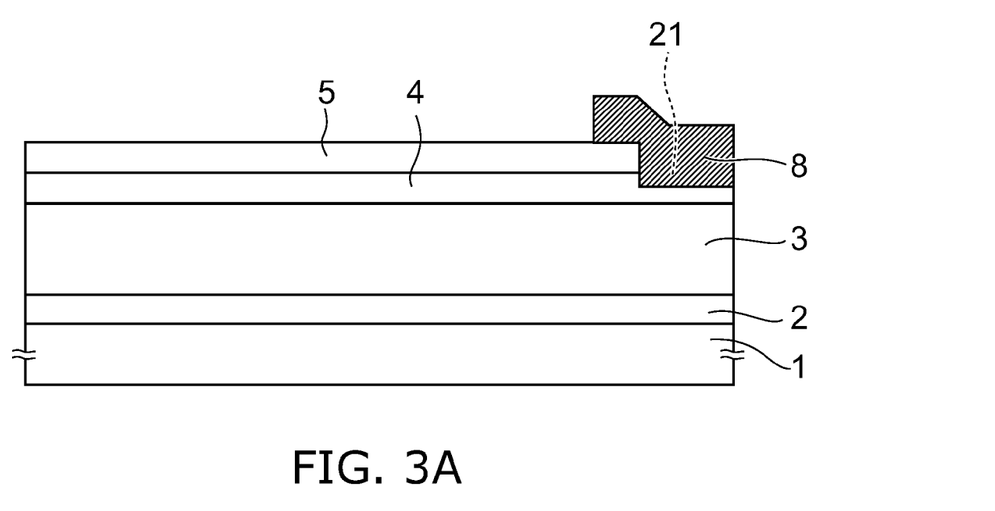

In the recess 21, as shown in FIG. 3A, a cathode electrode 8 as an ohmic electrode is formed. The cathode electrode 8 is e.g. a stacked film of a titanium film formed on the inner wall of the recess 21 and an aluminum film formed on this titanium film.

The stacked film is formed by evaporation technique using a resist film, not shown, as a mask. Then, the unnecessary portion of the stacked film is removed (lift-off) together with the resist film. Thus, the stacked film is left as a cathode electrode 8 in the recess 21.

Then, annealing at 750° C. by e.g. RTA (rapid thermal annealing) technique is performed for 30 seconds. By this annealing, the contact resistance between the cathode electrode 8 and the barrier layer 4 is reduced. Thus, the cathode electrode 8 makes ohmic contact with the barrier layer 4.

Figure 3B:
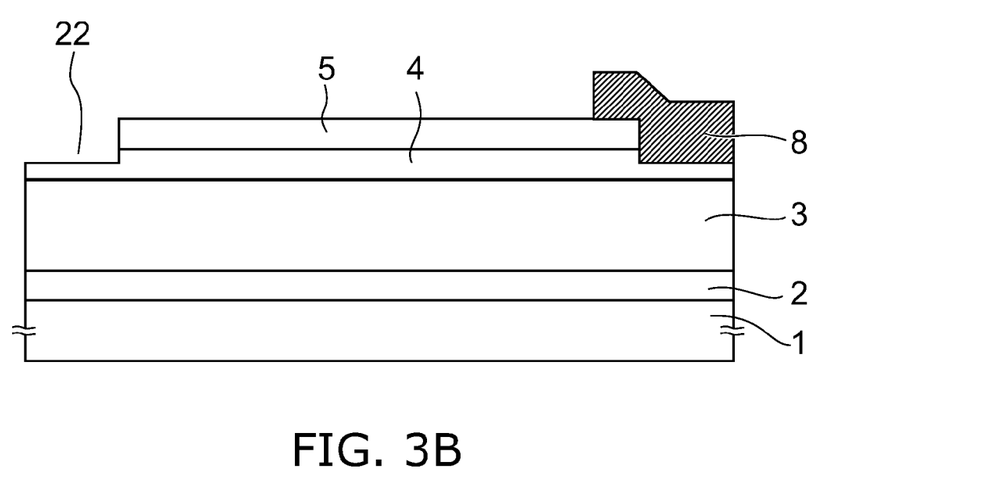

After forming the cathode electrode 8, as shown in FIG. 3B, another part of the cap layer 5 is etched to form a recess 22. For instance, by RIE technique using a chlorine-based gas, etching is performed halfway in the thickness direction of the barrier layer 4. The barrier layer 4 is exposed at the bottom of the recess 22.

Figure 4A:
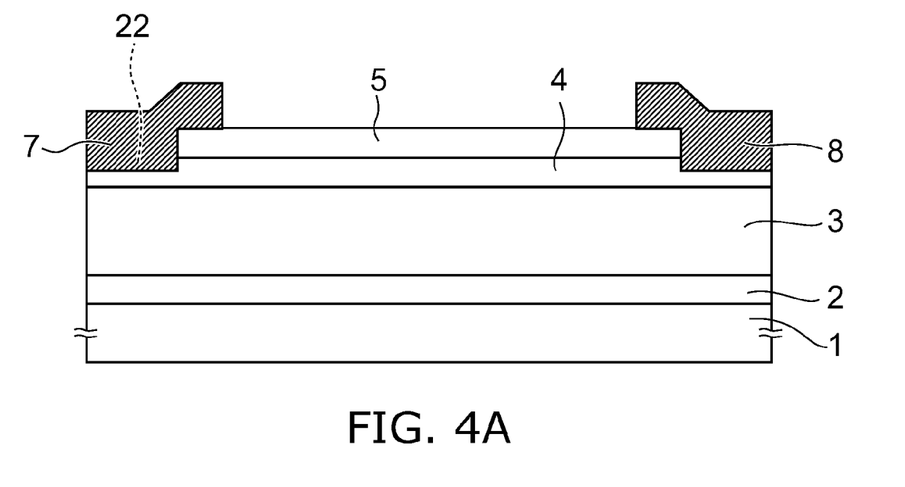

In the recess 22, as shown in FIG. 4A, an anode electrode 7 as a Schottky electrode is formed. The anode electrode 7 is e.g. a stacked film of a nickel film formed on the inner wall of the recess 22 and a gold film formed on this nickel film.

The stacked film is formed by evaporation technique using a resist film, not shown, as a mask. Then, the unnecessary portion of the stacked film is removed (lift-off) together with the resist film. Thus, the stacked film is left as an anode electrode 7 in the recess 22.

The anode electrode 7 is formed after the annealing for making ohmic contact between the cathode electrode 8 and the barrier layer 4. Thus, the anode electrode 7 does not make ohmic contact with the barrier layer 4 by the annealing for making ohmic contact between the cathode electrode 8 and the barrier layer 4. Accordingly, the Schottky contact between the anode electrode 7 and the barrier layer 4 is maintained.

Figure 6A:
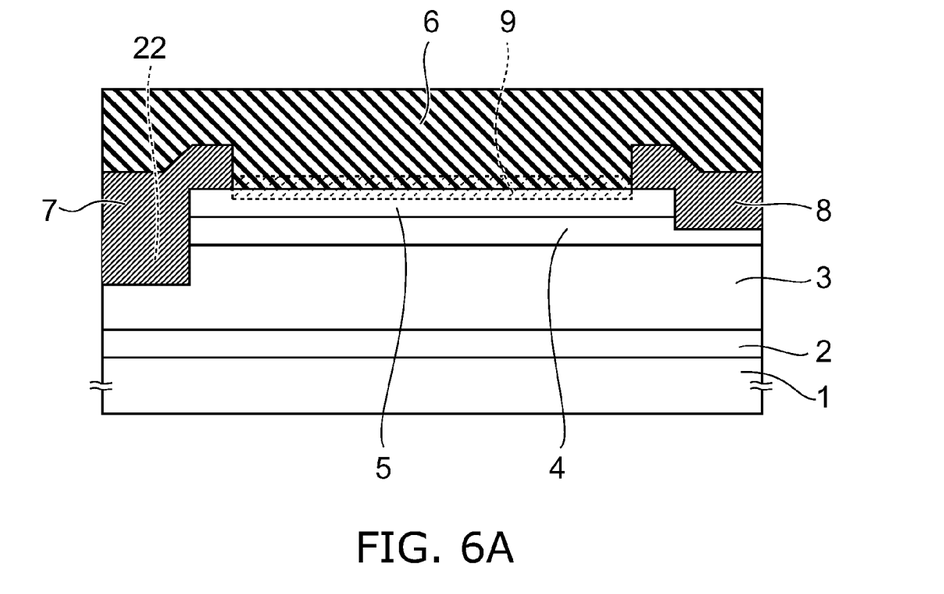
FIGS. 6A and 6B are schematic sectional views of another example of the semiconductor device of the first embodiment.

Here, as shown in FIG. 6A, the recess 22 may reach the channel layer 3. The anode electrode 7 may make Schottky contact with the channel layer 3.

Figure 4B:
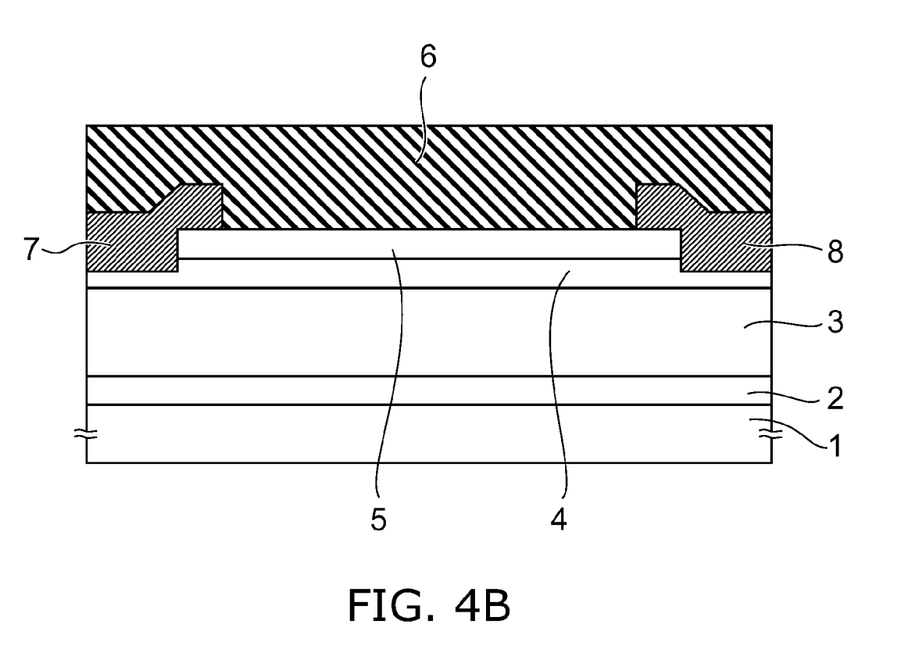

After forming the anode electrode 7, as shown in FIG. 4B, an insulating film 6 is formed on the cap layer 5, on the anode electrode 7, and on the cathode electrode 8. As the insulating film 6, for instance, a silicon nitride film is formed by CVD (chemical vapor deposition) technique.

After forming the insulating film 6, the aforementioned element is implanted by ion implantation technique into the surface region of the cap layer 5 in contact with the insulating film 6 between the anode electrode 7 and the cathode electrode 8.

Thus, as shown in FIG. 1, a region 9 with the crystal and interface levels destroyed by ion implantation is formed in the surface region of the cap layer 5 and the region of the insulating film 6 adjacent to the surface region on the side of the interface with the cap layer 5.

Figure 5A:
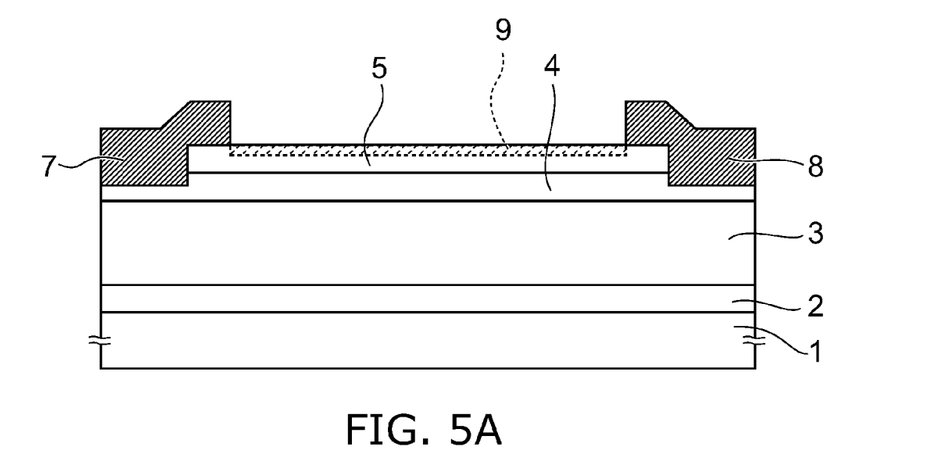
FIGS. 5A and 5B are schematic sectional views showing another method for manufacturing the semiconductor device of the first embodiment.

Here, alternatively, as shown in FIG. 5A, the aforementioned element may be ion-implanted into the surface region of the cap layer 5 before forming the insulating film 6. Subsequently, as shown in FIG. 5B, the insulating film 6 may be formed.

Figure 5B:
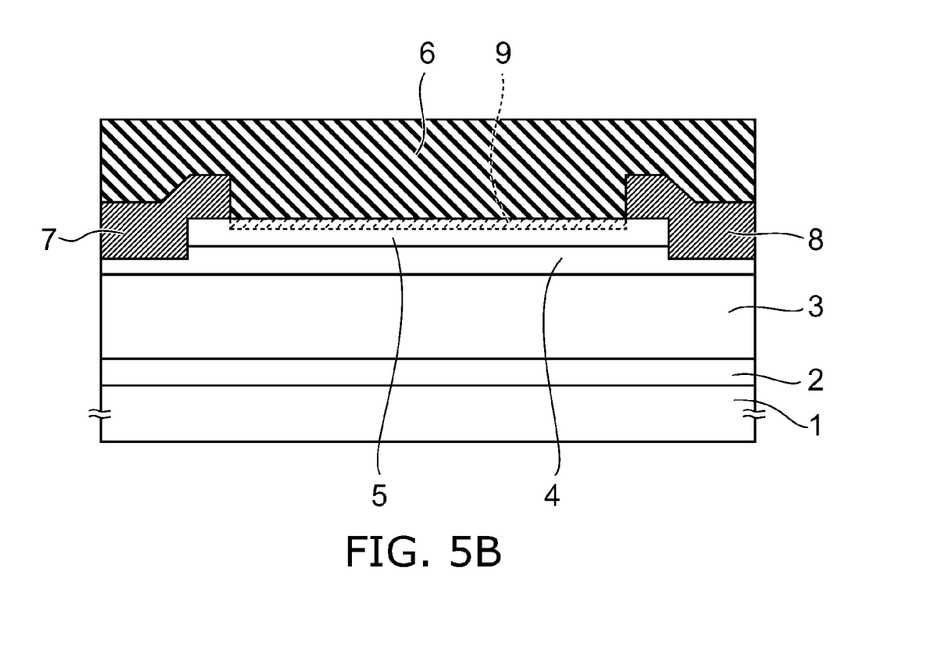

In this case, as shown in FIG. 5B, the ion-implanted region 9 is formed in the surface of the cap layer 5, but not formed in the insulating film 6.

Annealing is not performed after the ion implantation. Then, according to the embodiment, after the annealing for making ohmic contact between the cathode electrode 8 and the barrier layer 4, ion implantation is performed on the surface region of the cap layer 5. Thus, the ion-implanted element is not diffused by annealing. Accordingly, the implanted element is restricted within the surface region of the cap layer 5. The channel layer 3 and the barrier layer 4 contributing to the formation of the current path are not affected by the ion implantation. Thus, the crystallinity is not degraded, and there is no increase of on-resistance.

Figure 6B:
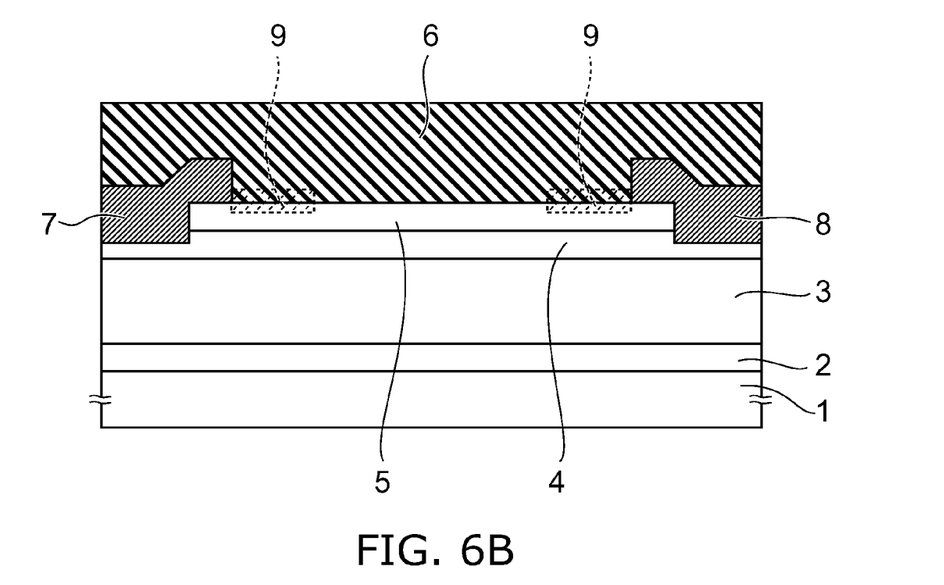

The ion-implanted region 9 is not limited to being formed throughout the entire surface of the surface region of the cap layer 5 between the anode electrode 7 and the cathode electrode 8. As shown in FIG. 6B, the ion-implanted region 9 may be selectively formed in the surface region of the cap layer 5 near the anode electrode 7, and in the surface region of the cap layer 5 near the cathode electrode 8.

Also in this case, part of the current leakage path via the interface between the cap layer 5 and the insulating film 6 can be provided with high insulating property resulting from the destruction of the crystal and interface levels. Furthermore, trapping of electrons upon application of high voltage causes the current collapse phenomenon. However, the trapping of electrons is likely to occur near the electrode. Thus, the destruction of interface levels near the electrode is effective in suppressing the current collapse phenomenon.

According to the first embodiment described above, a Schottky barrier diode with low leakage current can be provided without degrading the performance of the channel layer 3 and the barrier layer 4 contributing to the formation of the current path at ON time.

(Second Embodiment)

Figure 7A:
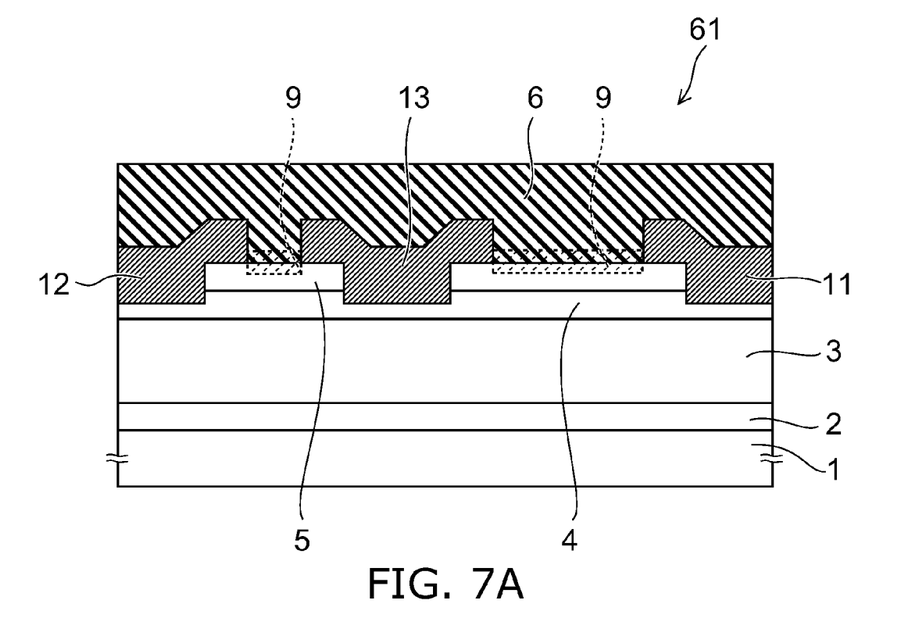
FIGS. 7A and 7B are schematic sectional views of a semiconductor device of a second embodiment.

FIG. 7A is a schematic sectional view of a semiconductor device 61 of a second embodiment. In the second embodiment, the semiconductor device 61 is exemplified by a Schottky gate transistor.

The semiconductor device 61 of the second embodiment is different from the semiconductor device (Schottky diode) 51 of the first embodiment in including a drain electrode 11 and a source electrode 12 as ohmic electrodes, and including a gate electrode 13 as a Schottky electrode.

In the semiconductor device 61 of the second embodiment, the same components as those of the semiconductor device 51 of the first embodiment are labeled with like reference numerals, and the detailed description thereof may be omitted.

The semiconductor device 61 of the second embodiment has a heterojunction structure of a channel layer 3 as a first nitride semiconductor layer and a barrier layer 4 as a second nitride semiconductor layer having a larger bandgap than the channel layer 3.

The channel layer 3 is provided on a substrate 1 via a buffer layer 2. The barrier layer 4 is provided on the channel layer 3. On the barrier layer 4, a cap layer 5 as a third nitride semiconductor layer is provided.

As in the first embodiment, the cap layer 5 is formed on the entire surface of the barrier layer 4 and partly removed. In the recess formed by removing part of the cap layer 5, a drain electrode 11, a source electrode 12, and a gate electrode 13 are provided.

The drain electrode 11, the source electrode 12, and the gate electrode 13 are spaced from each other. The gate electrode 13 is provided between the drain electrode 11 and the source electrode 12.

The drain electrode 11, the source electrode 12, and the gate electrode 13 each cover a step portion between the surface of the barrier layer 4 and the surface of the cap layer 5. Part of each electrode 11, 12, 13 extends over the surface of the cap layer 5.

An insulating film 6 is provided on the cap layer 5, on the drain electrode 11, on the source electrode 12, and on the gate electrode 13. The insulating film 6 is e.g. a silicon nitride film.

The insulating film 6 is in contact with the surface of the cap layer 5, and covers and protects the surface of the cap layer 5. Part of each electrode 11, 12, 13 is exposed from the insulating film 6 and connected to a wiring layer, not shown.

Also in the second embodiment, a two-dimensional electron gas is distributed near the interface of the channel layer 3 with the barrier layer 4. This two-dimensional electron gas serves as a current path in the Schottky gate transistor. By controlling the gate voltage applied to the gate electrode 13, the concentration of the two-dimensional electron gas below the gate electrode 13 is increased or decreased. Thus, the current flowing between the drain electrode 11 and the source electrode 12 can be controlled.

Also in the second embodiment, in the surface region of the cap layer 5 in contact with the insulating film 6 between the electrodes, an element heterogeneous or homogeneous with the constituent element of the cap layer 5 is implanted by ion implantation technique. More specifically, an ion-implanted region 9 is formed in the surface region of the cap layer 5 in contact with the insulating film 6 between the source electrode 12 and the gate electrode 13, and in the surface region of the cap layer 5 in contact with the insulating film 6 between the gate electrode 13 and the drain electrode 11.

The element heterogeneous or homogeneous with the cap layer 5 is implanted exclusively into the surface region of the cap layer 5, and does not reach the barrier layer 4 below the cap layer 5. Furthermore, after the ion implantation, annealing for diffusing the implanted element is not performed.

After the insulating film 6 is formed on the cap layer 5, ion implantation can be performed from the upper surface side of the insulating film 6. In this case, due to variation in the implantation depth control at that time, the ion-implanted region 9 is distributed over the surface region of the cap layer 5 and the region of the insulating film 6 on the cap layer 5 side across the interface between the cap layer 5 and the insulating film 6.

Alternatively, ion implantation may be performed on the surface region of the cap layer 5 before forming the insulating film 6. In this case, the ion-implanted region 9 is not formed in the insulating film 6.

Also in the second embodiment, in the ion-implanted region 9, the crystal of the cap layer 5 and interface levels existing at the interface between the cap layer 5 and the insulating film 6 are destroyed by the impact of the implanted element. Thus, the ion-implanted region 9 has high insulating property. This can significantly reduce the leakage current between the gate electrode 13 and the drain electrode 11 and between the gate electrode 13 and the source electrode 12 via the interface between the cap layer 5 and the insulating film 6.

Ion implantation is not performed on the channel layer 3 and the barrier layer 4. Thus, the channel layer 3 and the barrier layer 4 have high crystallinity. Accordingly, the current path (two-dimensional electron gas) is not affected by the ion implantation. Thus, the on-resistance of the Schottky gate transistor is not affected by the ion implantation.

Furthermore, interface levels existing at the interface between the cap layer 5 and the insulating film 6 are destroyed. This can suppress the current collapse phenomenon upon application of high voltage.

Also in the second embodiment, after annealing the ohmic electrode, a Schottky electrode is formed. Subsequently, ion implantation is performed on the surface region of the cap layer 5.

More specifically, after forming a drain electrode 11 and a source electrode 12, annealing is performed to make ohmic contact between the drain electrode 11 and the barrier layer 4, and ohmic contact between the source electrode 12 and the barrier layer 4.

Subsequently, a gate electrode 13 is formed. Thus, the gate electrode 13 does not make ohmic contact with the barrier layer 4 by the annealing for making ohmic contact between the ohmic electrode and the barrier layer 4. Accordingly, the Schottky contact between the gate electrode 13 and the barrier layer 4 is maintained.

Furthermore, the ion-implanted element is not diffused by the aforementioned annealing. Accordingly, the implanted element is restricted within the surface region of the cap layer 5. The channel layer 3 and the barrier layer 4 contributing to the formation of the current path are not affected by the ion implantation. Thus, the crystallinity is not degraded, and there is no increase of on-resistance.

Figure 7B:
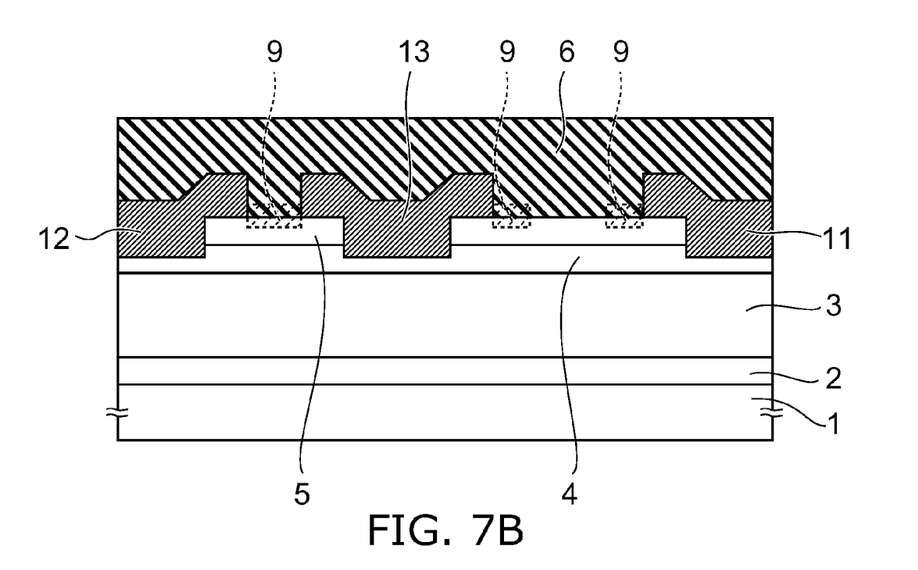

Also in the second embodiment, the ion-implanted region 9 is not limited to being formed throughout the entire surface of the surface region of the cap layer 5 between the ohmic electrode and the Schottky electrode. As shown in FIG. 7B, the ion-implanted region 9 may be selectively formed, for instance, in the surface region of the cap layer 5 near the gate electrode 13, and in the surface region of the cap layer 5 near the drain electrode 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a first nitride semiconductor layer containing a group III element;
    a second nitride semiconductor layer provided on the first nitride semiconductor layer, having a larger bandgap than the first nitride semiconductor layer, and containing a group III element;
    a third nitride semiconductor layer provided on the second nitride semiconductor layer and containing a group III element;

an insulating film being in contact with the third nitride semiconductor layer and provided on the third nitride semiconductor layer;
an ohmic electrode in ohmic contact with the second nitride semiconductor layer; and
a Schottky electrode in Schottky contact with the second nitride semiconductor layer,
a nitrogen concentration of a surface region of the third nitride semiconductor layer between the ohmic electrode and the Schottky electrode being higher than a nitrogen concentration of a region of the third nitride semiconductor layer of the second nitride semiconductor layer side.

2. The device according to claim 1, wherein the insulating film is a silicon nitride film, silicon oxide film, or silicon oxynitride film.

3. The device according to claim 1, wherein the device is a Schottky barrier diode including an anode electrode as the Schottky electrode and a cathode electrode as the ohmic electrode.

4. The device according to claim 1, wherein the device is a Schottky gate transistor including a drain electrode and a source electrode as the ohmic electrode and a gate electrode as the Schottky electrode, the gate electrode being provided between the drain electrode and the source electrode.

5. A method for manufacturing a semiconductor device, comprising:
forming a stacked structure having a first nitride semiconductor layer and a second nitride semiconductor layer provided on the first nitride semiconductor layer, the second nitride semiconductor layer containing a group Ill element, the first nitride semiconductor layer containing a group III element, the second nitride semiconductor layer having a larger bandgap than the first nitride semiconductor layer;
forming a third nitride semiconductor layer containing a group Ill element on the second nitride semiconductor layer;
forming an insulating film on the third nitride semiconductor layer, the insulating film being in contact with the third nitride semiconductor layer;
forming an ohmic electrode in ohmic contact with the second nitride semiconductor layer;
forming a Schottky electrode in Schottky contact with the second nitride semiconductor layer; and
implanting an element heterogeneous or homogeneous with the constituent element of the third nitride semiconductor layer into a surface region of the third nitride semiconductor layer by an ion implantation technique,
wherein a nitrogen concentration of the surface region of the third nitride semiconductor layer between the ohmic electrode and the Schottky electrode is higher than a nitrogen concentration of a region of the third nitride semiconductor layer which is disposed on the second nitride semiconductor layer.

6. The method according to claim 5, further comprising:
performing annealing after the forming the ohmic electrode,
wherein the Schottky electrode is formed after the annealing.

7. The method according to claim 5, further comprising:
performing annealing after the forming the ohmic electrode,
wherein the element is implanted into the surface region of the third nitride semiconductor layer after the annealing.

8. The method according to claim 5, wherein after the forming the insulating film on the third nitride semiconductor layer, the element is implanted into the surface region of the third nitride semiconductor layer and a region of the insulating film of the third nitride semiconductor layer side.

9. The method according to claim 5, wherein before the forming the insulating film on the third nitride semiconductor layer, the element is implanted into the surface region of the third nitride semiconductor layer.

* * * * *